(12) United States Patent
Fang et al.

(10) Patent No.: US 11,232,950 B2
(45) Date of Patent: Jan. 25, 2022

(54) STRUCTURE OF EPITAXY ON HETEROGENEOUS SUBSTRATE AND METHOD FOR FABRICATING THE SAME

(71) Applicant: INSTITUTE OF NUCLEAR ENERGY RESEARCH, ATOMIC ENERGY COUNCIL, EXECUTIVE YUAN, R.O.C., Taoyuan (TW)

(72) Inventors: Jheng Hao Fang, Taoyuan (TW); Yu Li Tsai, Taoyuan (TW); Hsueh-Hui Yang, Taoyuan (TW); Chih Hung Wu, Taoyuan (TW); Hwen Fen Hong, Taoyuan (TW)

(73) Assignee: Institute of Nuclear Energy Research, Atomic Energy Council, Executive Yuan, R.O.C., Taoyuan (TW)

(*) Notice: Subject to any disclaimer, the term of this patent is extended or adjusted under 35 U.S.C. 154(b) by 0 days.

(21) Appl. No.: 16/671,440

(22) Filed: Nov. 1, 2019

(65) Prior Publication Data

US 2020/0343093 A1 Oct. 29, 2020

(30) Foreign Application Priority Data

Apr. 24, 2019 (TW) ................................. 108114310

(51) Int. Cl.
*H01L 21/00* (2006.01)
*H01L 21/20* (2006.01)
*H01L 21/02* (2006.01)
*H01L 21/324* (2006.01)

(52) U.S. Cl.
CPC ...... *H01L 21/2015* (2013.01); *H01L 21/0243* (2013.01); *H01L 21/02104* (2013.01); *H01L 21/02293* (2013.01); *H01L 21/02667* (2013.01); *H01L 21/02694* (2013.01); *H01L 21/3245* (2013.01)

(58) Field of Classification Search
None
See application file for complete search history.

(56) References Cited

U.S. PATENT DOCUMENTS

2013/0320355 A1* 12/2013 Xie .................... H01L 33/20
257/76

* cited by examiner

*Primary Examiner* — Reema Patel
(74) *Attorney, Agent, or Firm* — Rosenberg, Klein & Lee

(57) ABSTRACT

The invention is a special designed pattern heterogeneous substrate, which is epitaxially deposited on a heterogeneous substrate by two step growth, and a thermal cycle annealing is added to reduce the lattice mismatch between the layers and the difference in thermal expansion coefficient, thereby obtaining a better stress. The quality of the semiconductor epitaxial layer is improved, and the present invention can easily grasp the timing of stress release when the semiconductor is grown on the heterogeneous substrate, avoid cracks in the semiconductor epitaxial layer, and form a crack free zone in the middle of the semiconductor epitaxial layer.

6 Claims, 11 Drawing Sheets

STRUCTURE OF EPITAXY ON HETEROGENEOUS SUBSTRATE AND METHOD FOR FABRICATING THE SAME

FIELD OF THE INVENTION

The present invention relates generally to a structure of heterogeneous substrate and a method for fabricating the same, and particularly to a structure of epitaxy on a heterogeneous substrate and a method for fabricating the same.

BACKGROUND OF THE INVENTION

In the recent development of the fabrication technology for semiconductor devices, how to grow III-V materials on a heterogeneous substrate successfully and give high-quality epitaxial layers has been the subject for people to invest great effort. Among the heterogeneous substrates, in addition preferred mechanical strength and good thermal conductivity, silicon substrates also own the advantages of low cost and large-area manufacturability, giving III-V devices opportunities of integration.

Nonetheless, growing heterojunctions on a heterogeneous substrate using gallium arsenide (GaAs) material face the challenge of the inherent differences in lattice constants and coefficients of thermal expansion. These differences induce lattice mismatch at the heterojunctions and form defects in epitaxial layers such as dislocations, anti-phase domain, and cracks. The existence of the defects will definitely limit the integration and development of III-V materials with silicon.

The general methods for solving the defects produced by growing III-V materials on a heterogeneous substrate include changing the parameters of growing GaAs on a heterogeneous substrate, using a super-lattice buffer layer, and using the silicon-germanium buffer-layer technology by altering the proportion of germanium. As for direct growth method, owing to the inherent significant differences between III-V materials and heterogeneous substrates, it is very difficult to fabricate preferred crystal quality and surface morphology. Besides, massive defects will exist in the epitaxial layers.

The wafer bonding technology according to the prior art adopts $SeS_2$ as the sacrificial layer between GaAs and a heterogeneous substrate. Then the lift-off technology is used to give the desired epitaxial layer material. Unfortunately, the technology is costly and not applicable to large sizes. Besides, in the development of the LED technology in recent years, the technology suffers from the problem of low yield.

Since the lattice constants and the coefficients of thermal expansion of GaAs and Ge are very close, the technology of using gradient $Si_{1-x}Ge_x$ as the buffer between the heterogeneous substrate and the epitaxial layer is highly expected. According to the technology, the ratio of the constitution is increased gradually from 0 to 100%. Thereby, the thickness is generally greater than 10 μm, which increases the difficulty and cost of the epitaxial process. When the epitaxial layer exceeds the threshold thickness, the stress will be released from the interface between dislocations. When the density of dislocations in a device is higher, the more defects will be produced, making the probability of non-radiative recombination increase. This not only limit the design flexibility of devices but also affects the characteristics of devices.

Although the technology of using graphene as the buffer layer between a heterogeneous substrate and the epitaxial layer solves the problem of excessive thickness of the SiGe gradient buffer layer, this method still faces two challenges. First, the process difficulty is increased. To be a buffer layer, the graphene must be thin and large. Secondly, the fabrication cost of using graphene is increased, which is contradictory to the initial purpose of reducing cost by using a heterogeneous substrate.

Accordingly, the above methods still face the problems of high defect and dislocation density, threshold thickness limitation for epitaxial layers, cracks formed in the epitaxial layers during the epitaxy process or in the temperature ramp-down period, or high manufacturing cost. The technologies according the prior art are limited on solving the problems.

The present invention provides a specially-designed patterned heterogeneous substrate. By using the two-step growth of epitaxy on the heterogeneous substrate along with the technology of thermal cycle annealing, the stress between epitaxial layers due to lattice mismatch and difference in coefficients of thermal expansion can be reduced and thus giving preferred quality of GaAs epitaxial layers. In addition, according to the present invention, the timing of releasing stress while growing GaAs on a heterogeneous substrate can be controlled with ease, making it applicable to multi junction solar cells and high-power electronic devices integrating III-V materials and silicon.

SUMMARY

An objective of the present invention is to provide a method for fabricating a patterned heterogeneous substrate. By using the two-step growth of epitaxy on a patterned silicon substrate along with the technology of thermal cycle annealing (TCA), a high-quality GaAs buffer epitaxy layer will be given.

To achieve the above objective, the present invention provides a method for fabricating epitaxy on a heterogeneous substrate, which comprises steps of: forming a plurality of patterned holes on a heterogeneous substrate to give a patterned heterogeneous substrate, and the plurality of patterned holes including a plurality of patterned tips; applying an arsenic hydride gas to the patterned heterogeneous substrate for depositing an arsenic stop layer on the patterned heterogeneous substrate; using a semiconductor material to deposit a semiconductor nucleation layer on the arsenic stop layer; depositing a semiconductor epitaxial layer on the semiconductor nucleation layer; using an thermal cycle annealing to rearrange the lattices of the semiconductor epitaxial layer, and using the plurality of patterned tips of the plurality of patterned holes to generate a plurality of cracks.

According to an embodiment of the present invention, the shape of the plurality of patterned holes is selected from the group consisting of rhomboid, square, and rectangle.

According to an embodiment of the present invention, the semiconductor material is selected from the group consisting of III-V semiconductor materials, II-VI semiconductor materials, and IV-VI semiconductor materials.

According to an embodiment of the present invention, the temperature range for recrystallization is between 800° C. and 900° C.

According to an embodiment of the present invention, the temperature for the first thermal cycle annealing and the second thermal cycle annealing is 800° C.

According to an embodiment of the present invention, after the step of using an thermal cycle annealing to rearrange the lattices of the semiconductor epitaxial layer such that a plurality of cracks on the semiconductor epitaxial layer are arranged along the plurality of patterned tips of the plurality of patterned holes, a step of depositing a semiconductor buffer layer on the semiconductor epitaxial layer.

To achieve the above objective, the present invention provides a structure of epitaxy on a heterogeneous substrate, which comprises a patterned heterogeneous substrate, an arsenic stop layer, a semiconductor nucleation layer, and a semiconductor epitaxial layer. The patterned heterogeneous substrate includes a heterogeneous substrate and a plurality of patterned holes, which are disposed in the heterogeneous substrate. The arsenic stop layer covers the patterned heterogeneous substrate. The semiconductor nucleation layer covers the arsenic stop layer. The semiconductor epitaxial layer is disposed on the semiconductor nucleation layer and includes a plurality of cracks.

According to an embodiment of the present invention, the shape of the plurality of patterned holes is selected from the group consisting of rhomboid, square, and rectangle.

According to an embodiment of the present invention, a GaAs buffer layer is disposed on the semiconductor epitaxial layer.

DETAILED DESCRIPTION

In order to make the structure and characteristics as well as the effectiveness of the present invention to be further understood and recognized, the detailed description of the present invention is provided as follows along with embodiments and accompanying figures. The concepts of the present invention can be embodied by various forms. Those embodiments are not used to limit the scope and range of the present invention.

The present invention adopts a specially-designed patterned heterogeneous substrate along with the technology of thermal cycle annealing for reducing the stress between epitaxial layers due to lattice mismatch and difference in coefficients of thermal expansion. By using the thermal cycle annealing, the stress can be released along the tips of the patterns and guided to the outer edges of the epitaxial layer. Thereby, a high-quality GaAs epitaxial layer will be given according to the present invention.

The methods for solving the defects produced by growing III-V materials on a heterogeneous substrate according to the prior art include changing the parameters of growing GaAs on a heterogeneous substrate, using a super-lattice buffer layer, and using the silicon-germanium buffer-layer technology by altering the proportion of germanium. Unfortunately, these methods still face the problems of high defect and dislocation density, threshold thickness limitation for epitaxial layers, cracks formed in the epitaxial layers during the epitaxy process or in the temperature ramp-down period.

According to the present invention, the stress between epitaxial layers due to lattice mismatch and difference in coefficients of thermal expansion can be released along the tips of the patterns and guided to the outer edges of the GaAs epitaxial layer for avoiding cracks in the GaAs epitaxial layer and hence forming crack-free zones.

Figure 1:
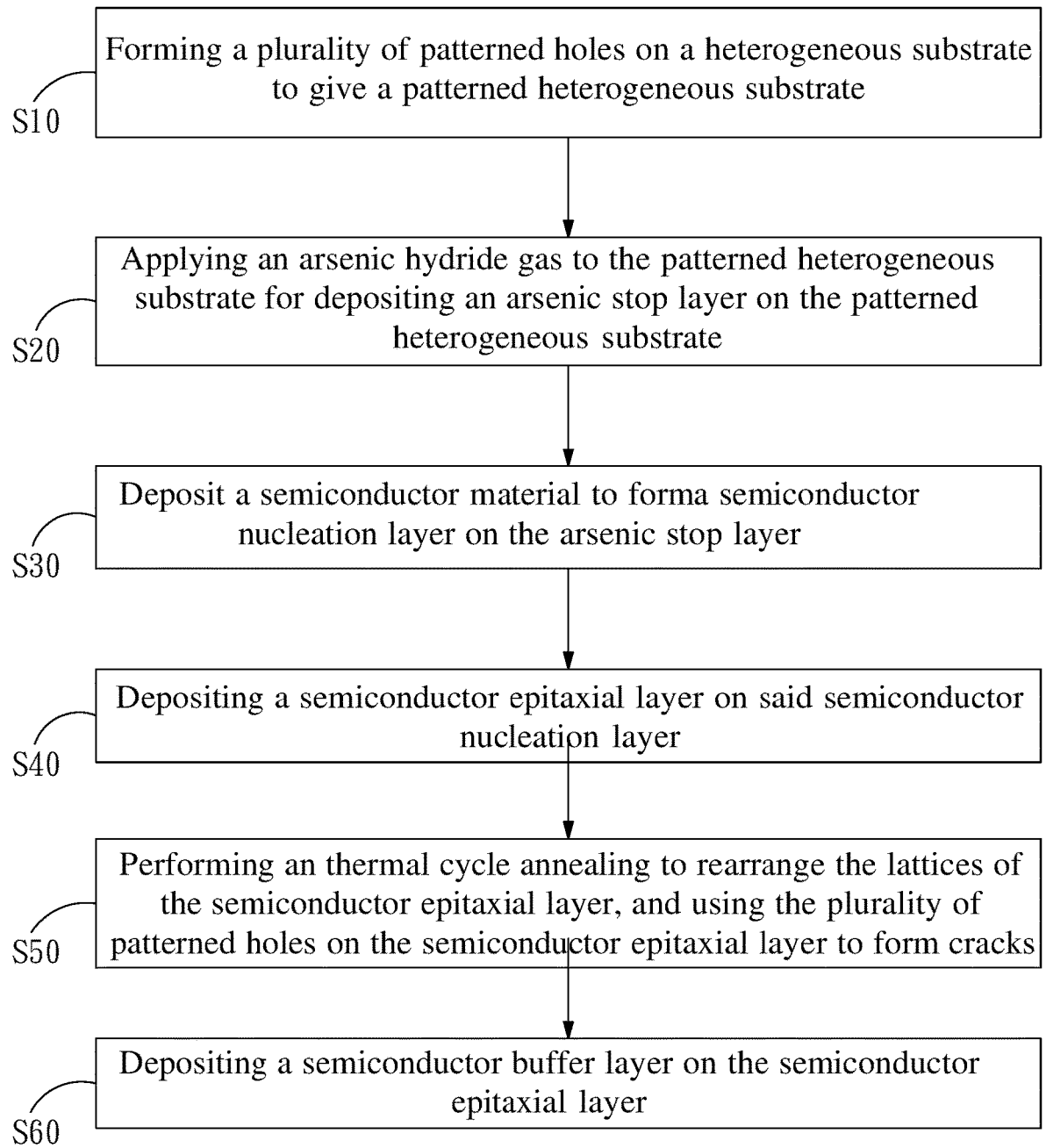
FIG. 1 shows a flowchart according to the method for fabricating epitaxy on a heterogeneous substrate of the present invention.

First, please refer to FIG. 1, which shows a flowchart according to the method for fabricating epitaxy on a heterogeneous substrate of the present invention.

Step S10: Forming a plurality of patterned holes on a heterogeneous substrate to give a patterned heterogeneous substrate;

Step S20: Applying an arsenic hydride gas to the patterned heterogeneous substrate for depositing an arsenic stop layer on the patterned heterogeneous substrate;

Step S30: Deposit a semiconductor material to forma semiconductor nucleation layer on the arsenic stop layer;

Step S40: Depositing a semiconductor epitaxial layer on the semiconductor nucleation layer;

Step S50: Performing an thermal cycle annealing to rearrange the lattices of the semiconductor epitaxial layer, and using the plurality of patterned holes on the semiconductor epitaxial layer to form cracks; and Step S60: Depositing a semiconductor buffer layer on the semiconductor epitaxial layer.

In the step S10, as shown in FIG. 1, which shows a flowchart according to the method for fabricating epitaxy on a heterogeneous substrate of the present invention, a plurality of patterned holes 113 are formed on the heterogeneous substrate 11 to give a patterned heterogeneous substrate 10. First, the heterogeneous substrate 11 is loaded to a coating machine for coating a layer of silicon dioxide ($SiO_2$) as the etching block layer. Next, the lithography technology are used to define patterns. Finally, a plurality of patterned holes are given by the etching method. Before epitaxy, the patterned heterogeneous substrate 10 is immersed in a hydrogen fluoride solution with the concentration of 1:50 (HF:$H_2O$) for two minutes. Then it is rinsed by deionized water (DI water) for three minutes. Afterwards, nitrogen is used to blow the surface of the heterogeneous substrate 11 before it is placed in a nitrogen spin dryer for drying.

As described above, the heterogeneous substrate 11 is selected from the group consisting of silicon, sapphire, aluminum nitride (AlN)/sapphire. According to a preferred embodiment of the present invention, the heterogeneous substrate 11 is, but not limited to, a silicon substrate is adopted.

While using the lithography technology, the positive photoresist or the negative photoresist can be adopted. If the positive photoresist is adopted for etching patterns, the finished patterns will protrude the heterogeneous substrate 11. If the negative photoresist is adopted, the plurality of patterned holes 113 will be produced. According to a preferred embodiment of the present invention, the negative photoresist is adopted. Nonetheless, the present invention is not limited to the embodiment.

Figure 3:
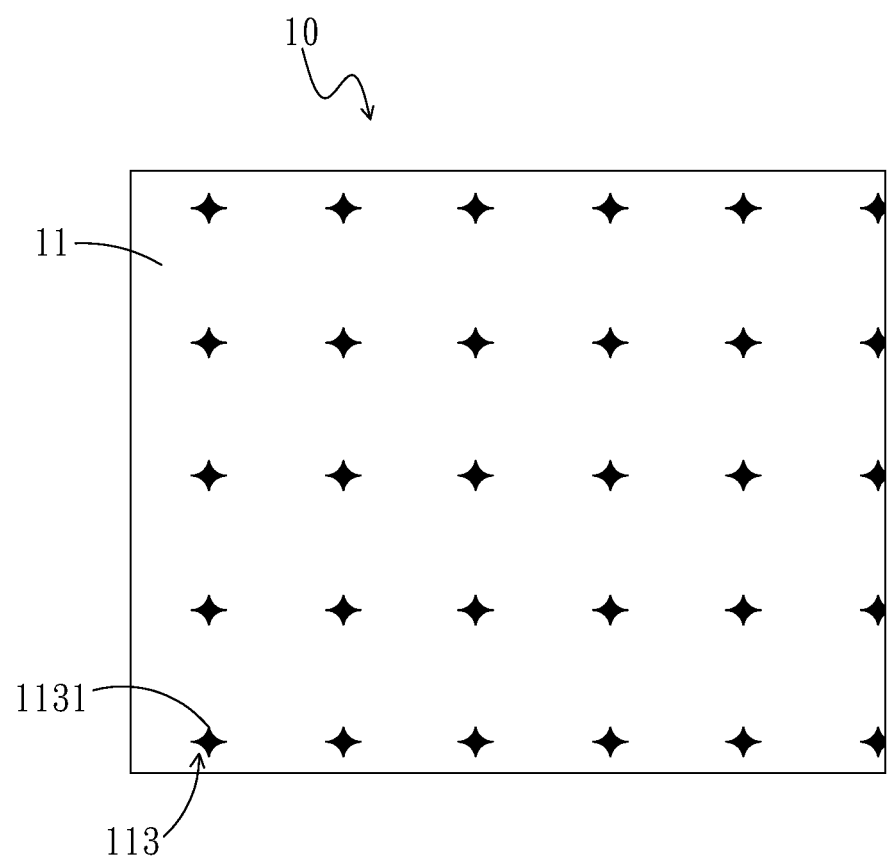
FIG. 3 shows a schematic diagram of the patterns according to the method for fabricating epitaxy on a heterogeneous substrate of the present invention.

The shape of plurality of patterned holes 113 is selected from the group consisting of rhomboid, square, and rectangle. According to a preferred embodiment of the present invention, the shape of plurality of patterned holes 113 is, but not limited to, a rhomboid. In addition, the plurality of patterned holes 113 include a plurality of patterned tips 1131. Please refer to FIG. 3, which shows a schematic diagram of the patterns according to the method for fabricating epitaxy on a heterogeneous substrate of the present invention.

Figure 4:
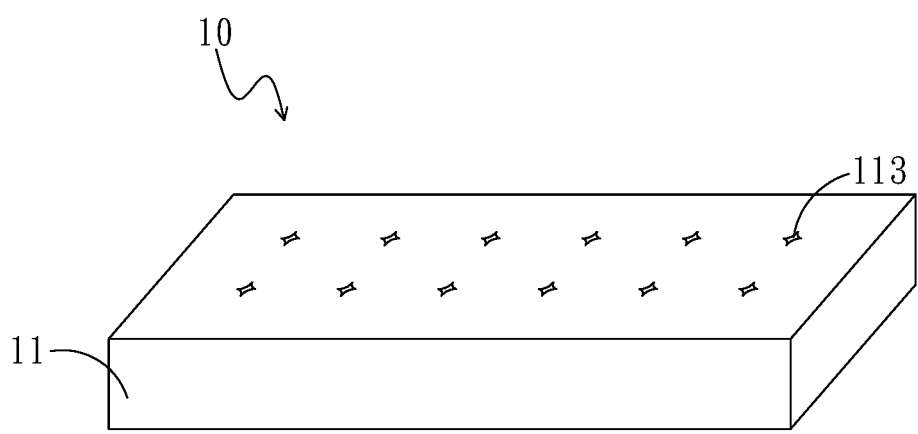
FIG. 4 shows a schematic diagram of the patterned holes according to the method for fabricating epitaxy on a heterogeneous substrate of the present invention.
Figure 5:
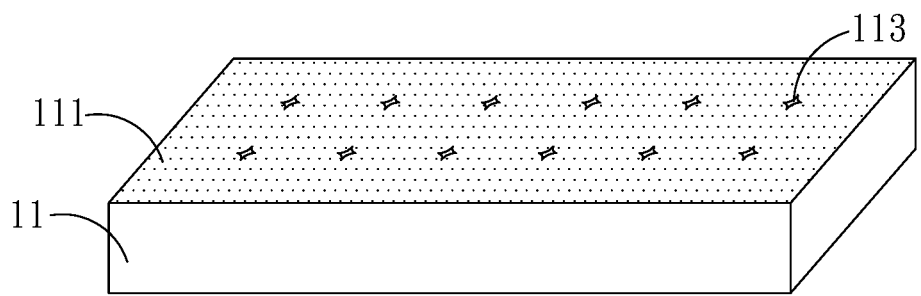
FIG. 5 shows a schematic diagram of the arsenic stop layer according to the method for fabricating epitaxy on a heterogeneous substrate of the present invention.
Figure 6:
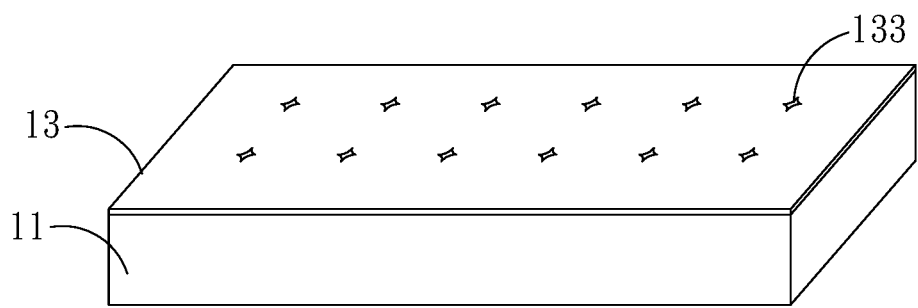
FIG. 6 shows a schematic diagram of the semiconductor nucleation layer according to the method for fabricating epitaxy on a heterogeneous substrate of the present invention.

Next, as shown in the steps S20 to S30, please refer to FIGS. 4, 5, and 6. FIG. 4 shows a schematic diagram of the patterned holes according to the method for fabricating epitaxy on a heterogeneous substrate of the present invention; FIG. 5 shows a schematic diagram of the arsenic stop layer according to the method for fabricating epitaxy on a heterogeneous substrate of the present invention; and FIG. 6 shows a schematic diagram of the semiconductor nucleation layer according to the method for fabricating epitaxy on a heterogeneous substrate of the present invention. A two-step growth process is performed on the patterned heterogeneous substrate 10. After forming the arsenic stop layer 111 using arsenic hydride 25 and hydrogen 23, the temperature is adjusted to 850° C. for recrystallization and forming a semiconductor nucleation layer 13 on the patterned heterogeneous substrate 10.

Figure 2:
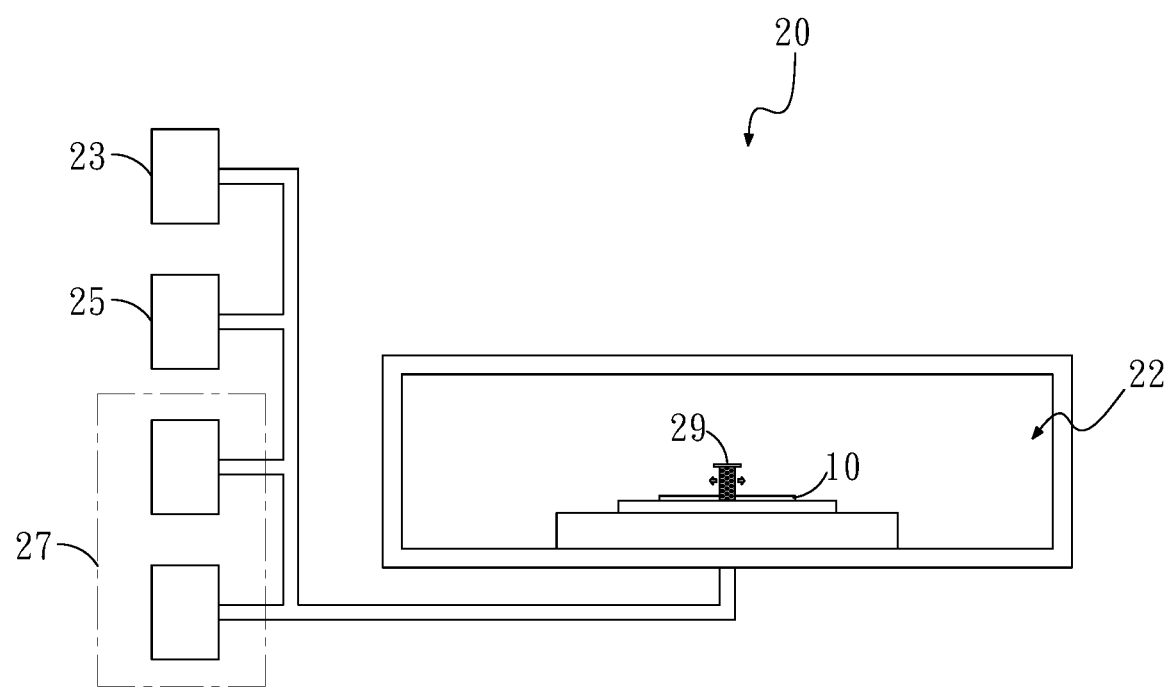
FIG. 2 shows a schematic diagram of the MOCVD system according to the method for fabricating epitaxy on a heterogeneous substrate of the present invention.

According to the present embodiment, the patterned heterogeneous substrate 10 after exposure in the step S10 is placed in a reaction chamber 22 of a horizontal metal-organic chemical vapor deposition (MOCVD) system. Please refer to FIG. 2, which shows a schematic diagram of the MOCVD system according to the method for fabricating epitaxy on a heterogeneous substrate of the present invention. In a hydrogen 23 ambient, the growth temperature is raised to 350° C. When the growth temperature is greater than 350° C., the arsenic hydride (AsH$_3$) 25 is guided into the reaction chamber 22 to react with the heterogeneous substrate 11 for forming the arsenic stop layer 111.

The deposition system according to the present embodiment is selected from the group consisting of the horizontal MOCVD system, the molecular beam epitaxy (MBE), and the liquid phase epitaxy (LPE). According to a preferred embodiment of the present invention, the deposition system is, but not limited to, the horizontal MOCVD system 20. In the horizontal MOCVD system 20, after the carrier gas passes through the container of a semiconductor material 27, the saturated vapor of the semiconductor material 27 will be carried to the reaction chamber 22 by a central gas guiding structure 29 to mix with other reaction gases. Then, on the heated heterogeneous substrate 11, chemical reactions will occur to grow the epitaxial layer.

Next, the temperature of the horizontal MOCVD system 20 is raised to 850° C. Meanwhile, the pressure of the horizontal MOCVD system 20 is adjusted. The hydrogen 23 and the arsenic hydride 25 are mixed and prebaked for 15 minutes for removing the native oxide layer on the heterogeneous substrate 10. Afterwards, the temperature is slowly lowered to 420° C. to 450° C., as well as reducing the pressure and adjusting the proportion of the semiconductor material 27 to form the semiconductor nucleation layer 13. These are the steps for the two-step growth process. The thickness of the semiconductor nucleation layer 13 is approximately 30 nm and a plurality of first spaces 133 are formed by extending the plurality of patterned holes 113 upwards.

The semiconductor material 27 is selected from the group consisting of III-V semiconductor materials, II-VI semiconductor materials, and IV-VI semiconductor materials. The III-V semiconductor materials are formed by Group III elements such as aluminum (Al), gallium (Ga), and indium (In) and Group V elements such as phosphorus (P), arsenic (As), and antimony (Sb). The II-VI semiconductor materials are formed by Group II elements such as zinc (Zn), cadmium (Cd), and mercury (Hg) and Group VI elements such as sulfur (S), selenium (Se), and tellurium (Te). The II-VI semiconductor materials are formed by silicon carbide (SiC) and germanium-silicon alloy (Ge—Si). According to a preferred embodiment of the present invention, the semiconductor material 27 is, but not limited to, a III-V semiconductor material.

Figure 7A:
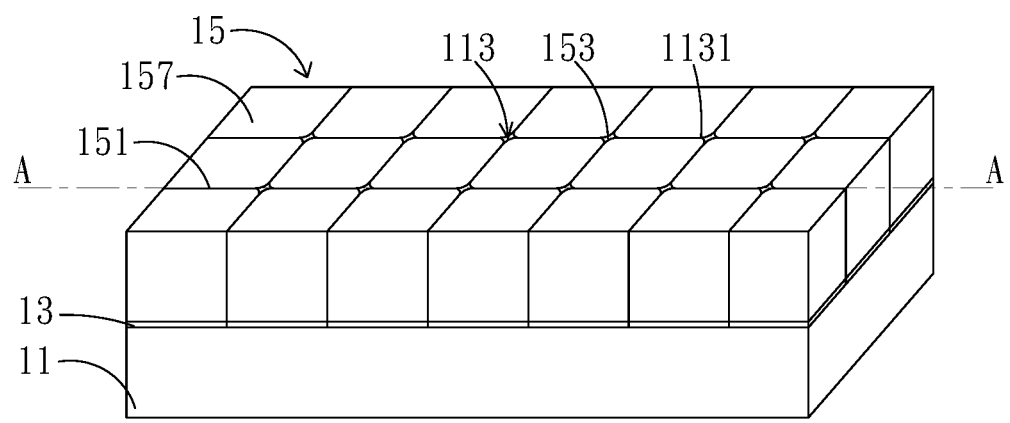
FIG. 7A shows a schematic diagram of the semiconductor epitaxial layer according to the method for fabricating epitaxy on a heterogeneous substrate of the present invention.

Next, as shown in the steps S40 to S60, please refer to FIG. 7A, which shows a schematic diagram of the semiconductor epitaxial layer according to the method for fabricating epitaxy on a heterogeneous substrate of the present invention. A semiconductor epitaxial layer 15 is formed on the semiconductor nucleation layer 13. By raising the temperature to 800° C. in the thermal cycle annealing, the lattices of the semiconductor epitaxial layer 15 is rearranged.

The semiconductor epitaxial layer 15 include a plurality of second spaces 153 extending from the plurality of first spaces 133 and a plurality of cracks 151.

According to the present embodiment, the growth temperature in the above step S30 is lowered slowly to 650° C. and the proportion of the semiconductor material 27 is adjusted for forming the semiconductor epitaxial layer 15 on the semiconductor nucleation layer 13 with a thickness of about 0.85 μm.

Then, the thermal cycle annealing is adopted for slowly lowering the temperature to 400° C. to 420° C. After stabilizing for 30 seconds, the growth temperature is raised to 800° C. at a rate of around 1° C. per second. By stabilizing for 5 minutes, the lattices of the semiconductor epitaxial layer 15 will be rearranged to form the plurality of cracks 151. The thermal cycle thermal cycle annealing according to the present invention can be executed once or multiple times. According to a preferred embodiment of the present invention, the thermal cycle annealing is executed, but not limited to, twice.

The thermal cycle thermal cycle annealing rearranges the lattices of the semiconductor epitaxial layer 15. Thereby, the process can improve the full width at half maximum of the semiconductor epitaxial layer 15 effectively. After high-temperature epitaxy, the semiconductor epitaxial layer 15 returns to the low-temperature state. The stress of the plurality of cracks formed due to the difference in the coefficients of thermal expansion can be released along the second paces 153 extending from the plurality of patterned holes 113 to the plurality of patterned tips. The stress can be guided and released to the outer edges of the semiconductor epitaxial layer 15 effectively, and forming crack-free zones 157 between the plurality of cracks 151.

Figure 7B:
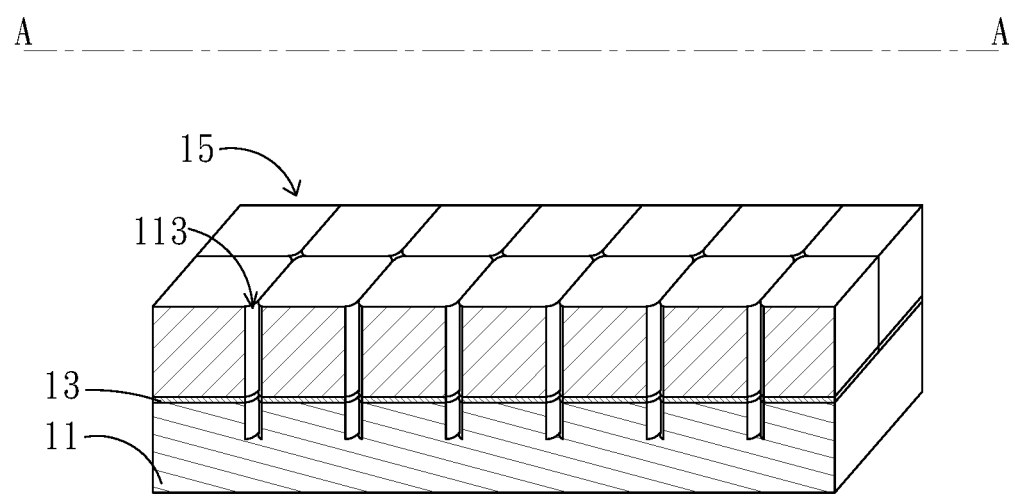
FIG. 7B shows a cross-sectional view of the semiconductor epitaxial layer according to the method for fabricating epitaxy on a heterogeneous substrate of the present invention.

FIG. 7B shows a cross-sectional view of the semiconductor epitaxial layer according to the method for fabricating epitaxy on a heterogeneous substrate of the present invention. In the figure, the locations of the plurality of patterned holes 113 are clearly illustrated. The plurality of patterned holes 113 are formed on the heterogeneous substrate 11 after exposure. According to the present invention, the semiconductor epitaxial layer 15 is deposited on the patterned heterogeneous substrate 10. Under the guidance of the patterned heterogeneous substrate 10, the deposited semiconductor epitaxial layer 15 also includes the plurality of patterned holes 113.

Figure 9:
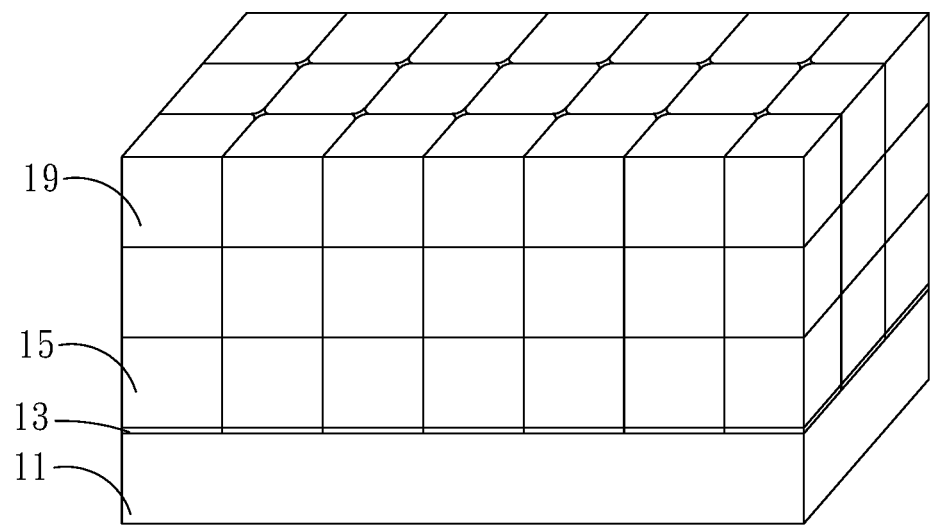
FIG. 9 shows a schematic diagram of multiple epitaxial layers according to the method for fabricating epitaxy on a heterogeneous substrate of the present invention.

Please refer to FIG. 9, which shows a schematic diagram of multiple epitaxial layers according to the method for fabricating epitaxy on a heterogeneous substrate of the present invention. As shown in the figure, multiple layers of semiconductor epitaxial layers 15 can be fabricated. By executing multiple thermal cycle annealinges, the plurality of cracks 151 can be formed along the plurality of patterned tips of the plurality of patterned holes for each layer of the semiconductor epitaxial layers 15, and hence giving complete crystallization of the semiconductor epitaxial layer 15.

Figure 8:
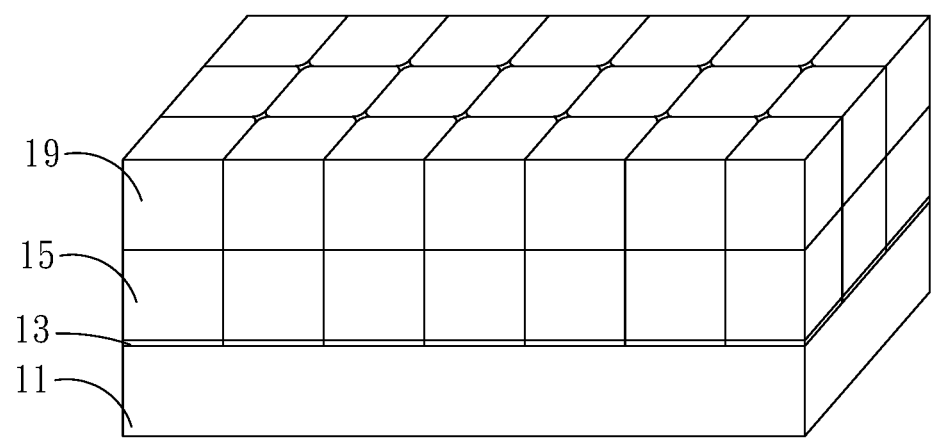
FIG. 8 shows a schematic diagram of the semiconductor buffer layer according to the method for fabricating epitaxy on a heterogeneous substrate of the present invention.

Next, as shown in the step S60, please refer to FIG. 8, which shows a schematic diagram of the semiconductor buffer layer according to the method for fabricating epitaxy on a heterogeneous substrate of the present invention. As shown in the figure, the growth temperature is lowered slowly to 650° C., as well as adjusting the pressure and the proportion of the semiconductor material 27 for forming a semiconductor buffer layer 19 on the semiconductor epitaxial layer 15. The thickness of the semiconductor buffer layer 19 is around 1.5 μm. After the step of forming the semiconductor buffer layer 19, the whole epitaxy steps are completed. The growth temperature can be lowered slowly to the room temperature.

Figure 10:
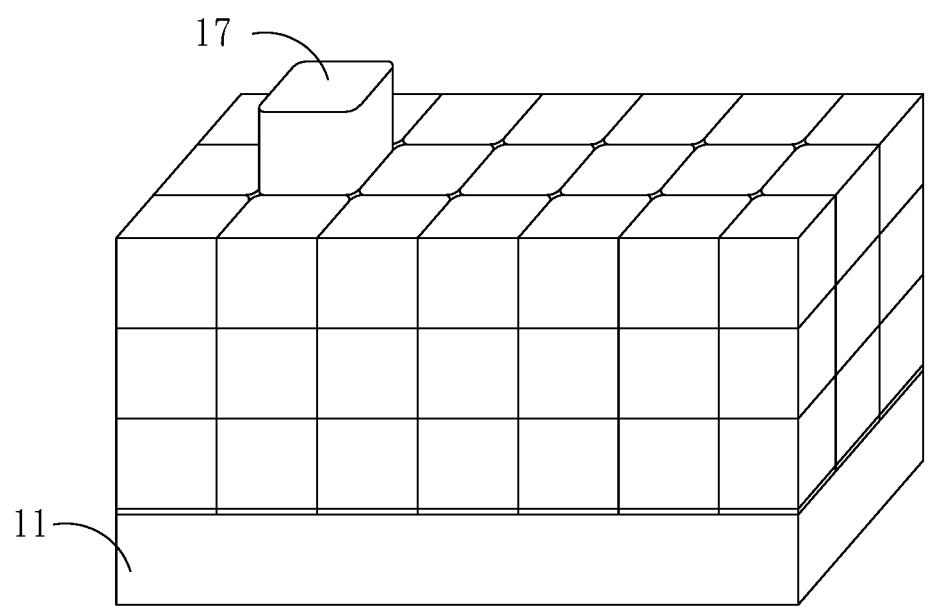
FIG. 10 shows a schematic diagram of the application according to the method for fabricating epitaxy on a heterogeneous substrate of the present invention.

After finishing the complete semiconductor epitaxial layer 15, please refer to FIG. 10, which shows a schematic diagram of the application according to the method for fabricating epitaxy on a heterogeneous substrate of the present invention. As shown in the figure, when the semiconductor epitaxial layer 15 is finished, an optoelectronic device 17 can be further fabricated on the semiconductor buffer layer 19 for subsequent usage.

According to the present invention, hydrogen is adopted in a high-temperature thermal cycle annealing to induce recrystallization of GaAs for reducing the density of nucleuses on the surface gradually. Aggregating smaller nucleuses to larger ones facilitates the nucleuses to grow single-crystalline semiconductor buffer layer in both the horizontal and vertical directions. Besides, in the reaction chamber 22, the hydrogen 23 is used in the thermal cycle thermal cycle annealing. In addition to suppressing lattice mismatch between the semiconductor epitaxial layer 15 and the substrate, by using the high- and low-temperature annealing cycles, the crystals can be rearranged and thus giving preferred epitaxy quality, as well as avoiding cracks within the epitaxial layer and forming the crack-free zones 157 therebetween.

According to the above embodiments of the present invention, the technology of a patterned heterogeneous substrate is adopted. By a two-step growth process, epitaxy is formed on the heterogeneous substrate. Then the thermal cycle annealing is used to grow GaAs epitaxy. By using the thermal cycle annealing, the stress produced by the difference in the coefficients of thermal expansion and lattice mismatch can be released through the patterned tips. Thereby, cracks can be avoided in the GaAs epitaxial layer and hence giving a high-quality GaAs epitaxial layer.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A method for fabricating epitaxy on a heterogeneous substrate, comprising steps of:
    forming a plurality of patterned holes on a heterogeneous substrate to give a patterned heterogeneous substrate, and said plurality of patterned holes including a plurality of patterned tips;
    applying an arsenic hydride gas to said patterned heterogeneous substrate for depositing an arsenic stop layer on said patterned heterogeneous substrate;
    depositing a semiconductor material to form a semiconductor nucleation layer on said arsenic stop layer;
    depositing a semiconductor epitaxial layer on said semiconductor nucleation layer; and
    performing an thermal cycle annealing process to rearrange the lattices of said semiconductor epitaxial layer, and using said plurality of patterned tips of said plurality of patterned holes to generate a plurality of cracks.

2. The method for fabricating epitaxy on a heterogeneous substrate of claim 1, wherein the shape of said plurality of patterned holes is selected from the group consisting of rhomboid, square, and rectangle.

3. The method for fabricating epitaxy on a heterogeneous substrate of claim 1, wherein said semiconductor material is selected from the group consisting of III-V semiconductor materials, II-VI semiconductor materials, and IV-VI semiconductor materials.

4. The method for fabricating epitaxy on a heterogeneous substrate of claim 1, wherein a temperature range for said thermal cycle annealing is between 800° C. and 900° C.

5. The method for fabricating epitaxy on a heterogeneous substrate of claim 1, wherein a temperature for said thermal cycle annealing is 800° C.

6. The method for fabricating epitaxy on a heterogeneous substrate of claim 1, and after the step of using an thermal cycle annealing to rearrange the lattices of said semiconductor epitaxial layer such that a plurality of cracks on said semiconductor epitaxial layer are arranged along said plurality of patterned tips of said plurality of patterned holes, further comprising a step of depositing a semiconductor buffer layer on said semiconductor epitaxial layer.

* * * * *